United States Patent [19]
Drost et al.

[11] Patent Number: 5,912,567
[45] Date of Patent: Jun. 15, 1999

[54] DUAL DIFFERENTIAL COMPARATOR WITH WEAK EQUALIZATION AND NARROW METASTABILITY REGION

[75] Inventors: Robert J. Drost, Palo Alto; Robert J. Bosnyak, San Jose; Jose M. Cruz, Menlo Park, all of Calif.

[73] Assignee: Sun Microsystems, Inc., Palo Alto, Calif.

[21] Appl. No.: 08/956,183

[22] Filed: Oct. 22, 1997

[51] Int. Cl.⁶ .................................................. G11C 27/02
[52] U.S. Cl. .............................. 327/89; 327/91; 395/559
[58] Field of Search .................................... 395/555, 559; 364/488, 489, 490, 491; 327/89, 90, 91, 94, 96

[56] References Cited

U.S. PATENT DOCUMENTS

| | | | |
|---|---|---|---|
| 5,311,085 | 5/1994 | Pelgrom et al. | 307/494 |
| 5,510,736 | 4/1996 | Van de Plassche | 327/91 |
| 5,646,620 | 7/1997 | Regier | 341/118 |
| 5,801,554 | 9/1998 | Momma et al. | 327/89 |

OTHER PUBLICATIONS

B. Razavi, "*Principles of Data Conversion System Design*", IEEE Press, (1995), Chapter 2, pp. 7–27.

A. Fiedler, et al., "*A 1.0625Gbps Transceiver With 2x–Oversampling and Transmit Signal Pre–Emphasis*", 1997 IEEE International Solid State Circuits Conference, Session 15, Serial Data Communications, Paper FP 15.1, pp. 238–239.

Chih–Kong Ken Yang, et al. "*A 0.8–μm CMOS 2.5 Gb/s Oversampling Receiver and Transmitter for Serial Links*", IEEE Journal of Solid State Circuits, vil. 31, No. 12, Dec. 1996, pp. 2015–2023.

*Primary Examiner*—Dennis M. Butler
*Attorney, Agent, or Firm*—Philip H. Albert; Townsend and Townsend and Crew

[57] ABSTRACT

In a sample-and-hold circuit, an input is tracked at an output during a tracking period and the input is held during an holding period, the tracking period and holding period defined by a clock signal input to the sample-and-hold circuit, wherein the output is a differential output having a positive output node and a negative output node with the output signal represented by a voltage difference from the negative output node to the positive output node. During the tracking period, an equalizing transistor between the output nodes is turned on to bring the output to a common mode level for the output. During the holding period, the equalizing transistor is turned off and a regenerative circuit drives the output nodes apart, thus amplifying the input signal.

8 Claims, 9 Drawing Sheets

| FIG. 7A. | FIG. 7B. | ns
DUAL DIFFERENTIAL COMPARATOR WITH WEAK EQUALIZATION AND NARROW METASTABILITY REGION

BACKGROUND OF THE INVENTION

The present invention relates to the field of comparators. More specifically, one embodiment of the invention provides an improved sample-and-hold comparator which can amplify a signal at high-speed.

Using latches for amplifying digital signals are known. One such latch, a "Yang" latch, is described in CK. Yang, M. Horowitz, "A 0.8-um CMOS 2.5 Gb/s Oversampling Receiver and Transmitter for Serial Links," *IEEE J. Solid-State Circuits*, vol. 31, no. 12, pp. 2015–23 (December, 1996). The Yang latch uses aggressive equalization to handle intersymbol interference. A disadvantage to the Yang latch is that the aggressive equalization loads additional capacitance on the output and thereby reduces the effective bandwidth of the latch. Additionally, the Yang latch requires complementary clocks and thus raises the problem of trying to maintain tight timing margins between the complementary clock signals.

A. Fiedler, et al., "A 1.0625 Gbps Transceiver with 2×Oversampling and Transmit Signal Pre-Emphasis," ISSCC Dig. Tech. Papers, pp. 238–39 (February, 1997) describes another latch which does use a single clock phase to control a regenerative amplify mechanism in series with an input differential pair, but results in an increased metastability window since the input data is allowed to move during a amplification period.

From the above it is seen that an improved comparator for use in a sample-and-hold latch is needed.

SUMMARY OF THE INVENTION

An improved sample-and-hold circuit is provided by virtue of the present invention. In one embodiment of a sample-and-hold circuit according to the present invention, an input is tracked at an output during a tracking period and the input is held during an holding period, the tracking period and holding period defined by a clock signal input to the sample-and-hold circuit, wherein the output is a differential output having a positive output node and a negative output node with the output signal represented by a voltage difference from the negative output node to the positive output node. During the tracking period, an equalizing transistor between the output nodes is turned on to bring the output to a common mode level for the output. During the holding period, the equalizing transistor is turned off and a regenerative circuit drives the output nodes apart, thus amplifying the input signal.

A further understanding of the nature and advantages of the inventions herein may be realized by reference to the remaining portions of the specification and the attached drawings.

DESCRIPTION OF THE PREFERRED EMBODIMENTS

Figure 1:
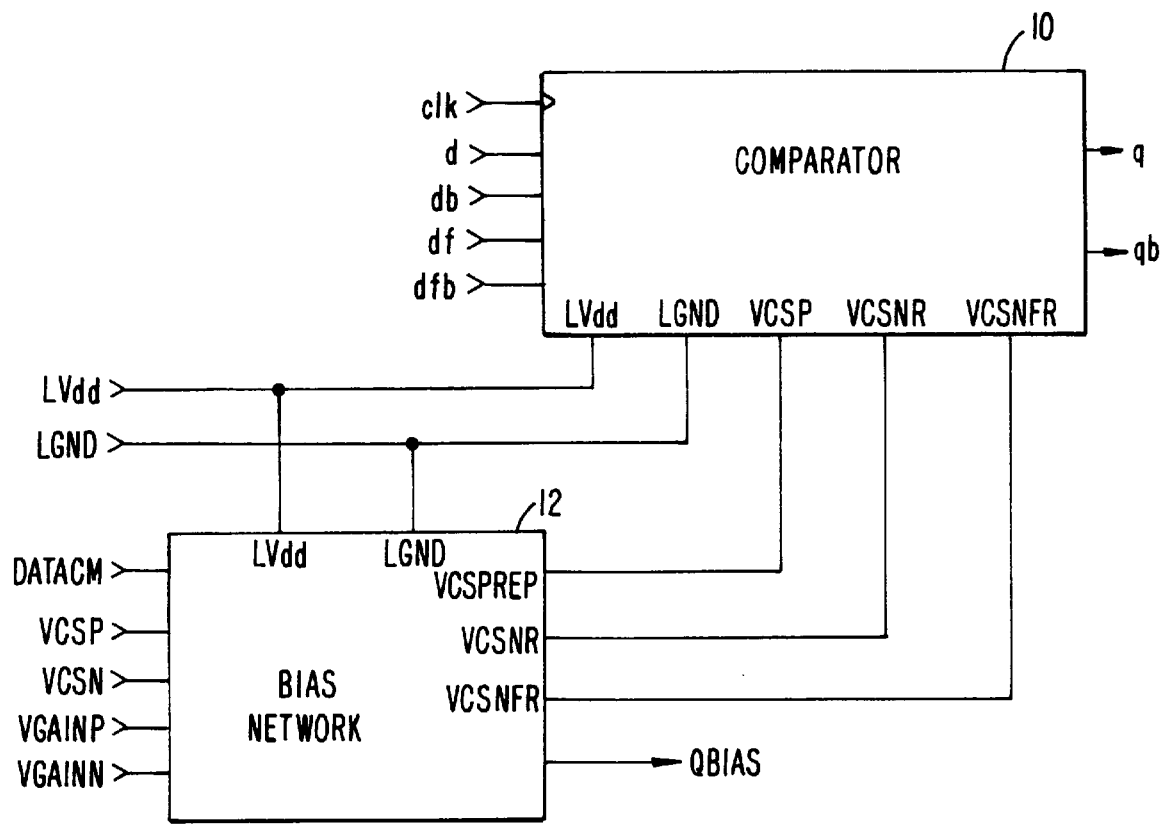
FIG. 1 is a block diagram of a comparator according to the present invention coupled to a bias network.

FIG. 1 shows a comparator 10 coupled to a bias network 12. Comparator 10 is a dual differential input, high-gain comparator with weak equalization. Comparator 10 is configured for high-speed operation and provides for a narrow metastability region with single phase clocking. As described herein, common-mode compensation is provided to extend a common-mode range of the input signal. Consequently, comparator 10 has many applications. One such application will be used as an example in explaining the operation of the circuits described herein, but it should be understood that the present invention is not limited to such applications. In the example, comparator 10 is used to amplify a high-speed binarized signal, as might be needed in a transceiver in a high-speed (on the order of gigabits per second) serial link.

One problem such a circuit must solve is how to amplify a relatively small input differential signal (typically less than 100 mV) to a much larger signal, providing a gain such as four or greater. For example, the circuit might be provided to amplify a 75 mV signal up to a 3 V signal, with the circuits spaced along the serial link such that the circuits counteract the attenuation of the signal as it travels through the serial link. As the input signal is typically a sequence of binary symbols, intersymbol interference due to the amplification process should be minimized. The circuit described herein provides these features, using an amplifier of limited bandwidth, which might otherwise introduce intersymbol interference. The circuit is also able to provide these features without excessive parasitic capacitance (which could reduce the amplifier bandwidth), with a narrow metastability window. As described below, a single clock is used to avoid complexities of clock alignment.

As shown in FIG. 1, comparator 10 includes four inputs. In one variation, the D and DB inputs receive the data signal as a differential input and the DF and DFB inputs receive a filtered differential input, as might be provided by a circuit for offset cancellation, echo cancellation, decision feedback equalization or some other analog filter equalization. As the D/DB and DF/DFB input stages are entirely symmetrical, there is nothing in comparator 10 that requires that the DF/DFB signal be filtered, or that D/DB are coupled to the original data signal instead of DF/DFB.

FIG. 1 also shows five bias levels being provided to comparator 10. Two of these bias levels, LVDD and LGND, are provided to both comparator 10 and bias network 12, for powering the circuits. LVDD and LGND are typically tied to the VDD and GND rails for the chip on which comparator 10 is fabricated, such as 3.3 V and 0 V. However, they can be other voltages as needed, so long as they accommodate the common-mode range on the inputs. The other three bias levels, VCSP, VCSNR and VCSNFR, are provided to comparator 10 by bias network 12. The use and effect of those bias levels is explained below with reference to FIG. 2. The outputs Q and QB form a differential output of the amplified signal. QBIAS is equal to the Q/QB common-mode output level of comparator 10, and is provided to circuits needing such a level.

Figure 2:
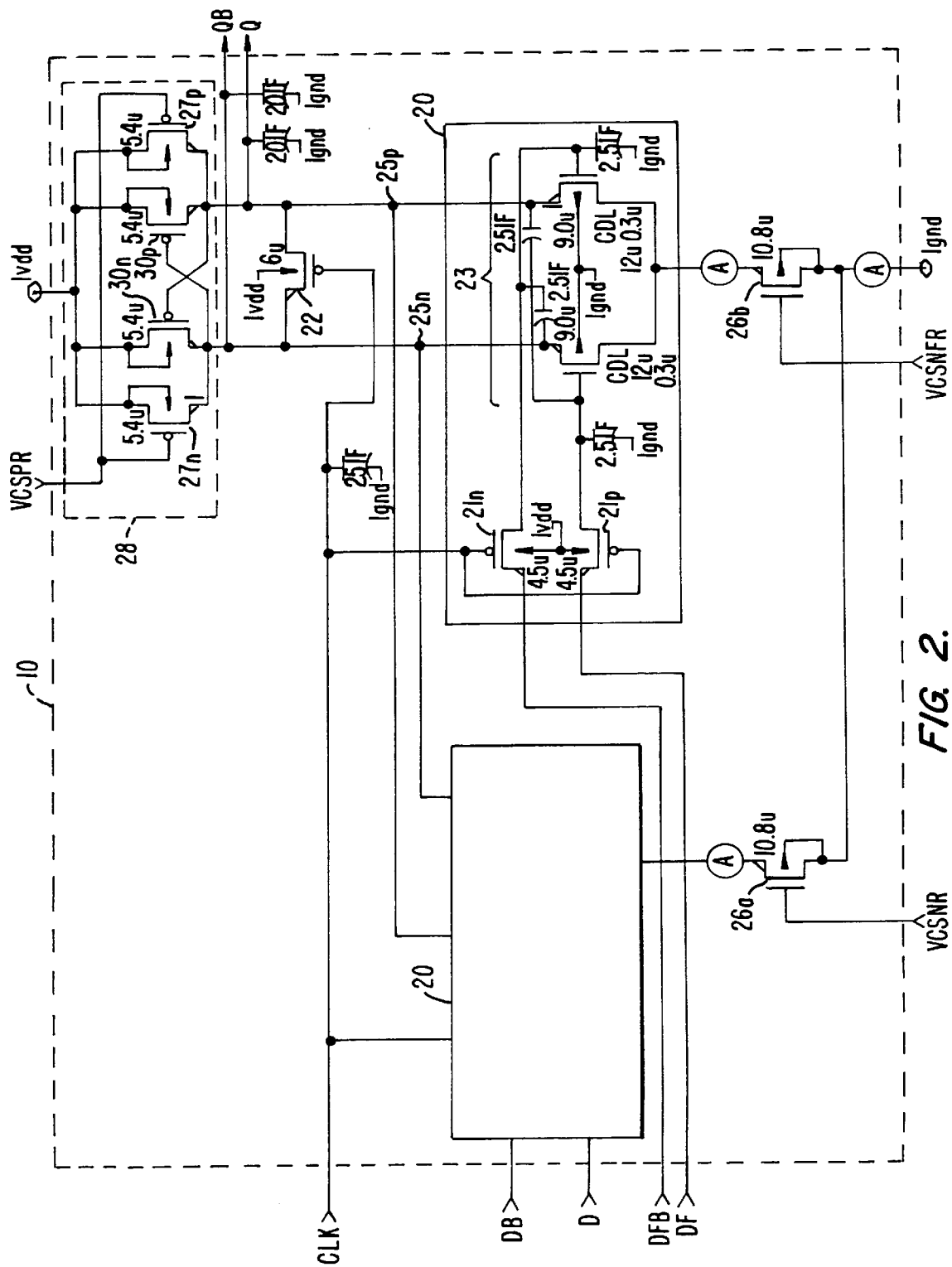
FIG. 2 is a schematic diagram showing the comparator of FIG. 1 in greater detail.

FIG. 2 shows comparator 10 in greater detail. In comparator 10, two input stages 20 are provided (only one is shown in detail). The CLK signal separates the operation of comparator 10 into two modes. When CLK is low, comparator 10 is in a tracking mode and when CLK goes high, comparator 10 switches to a holding mode. In the tracking mode, the input signals pass through gating transistors 21 to a differential transistor pair 23. Gating transistors 21 in the DF/DFB input stage shown in FIG. 2 comprise gating transistor 21p. which gates the DF input signal and gating transistor 21n gates the DFB input signal. Differential transistor pair 23 drives outputs Q and QB, but an equalizing transistor 22, which is turned on in the tracking mode, urges Q and QB together, toward a common-mode output level. As should be apparent, any two representations of the input signal can be provided at the D/DB and DF/DFB differential inputs.

The outputs of the two differential transistor pairs 23 (only one is shown), are combined at nodes 25p and 25n so that they both contribute to the output signal. The relative contributions of input stages 20 is controlled by a ratio of VCSNR and VCSNFR, as VCSNR controls the tail current in the D/DB input stage using transistor 26a and VCSNFR controls the tail current in the DF/DFB input stage using transistor 26b. The combined tail currents are controlled by VCSPR using transistors 27n and 27p which are part of transistor network 28.

In the holding mode, gating transistors 21 are turned off, disconnecting the inputs from differential transistor pairs 23 and equalizing transistor 22 is turned off. This allows the Q and QB outputs to separate to form the output signal representative of the input signal at the time CLK went high. A regenerator made up of cross-coupled transistors 30n and 30p cause further separation of the output signal. Since the transistors in differential transistor pairs 23 are kept in saturation and the output is at the common-mode level for the output when the holding period starts, there is no delay while a circuit pumps up the output from an arbitrary level.

Comparator 10 provides for a sharp metastability window even though a phase error may be introduced due to the fact that equalization transistor 22 is not sized to remove all of a preceding bit signal during a tracking mode. If equalization transistor 22 is made large enough to completely absorb a preceding bit signal during the tracking period, it might result in excessive capacitance on the output and reduce the bandwidth of comparator 10. Instead, a smaller transistor is used. If the preceding bit is the same value as the current bit, then there is no signal that needs to be removed since the input is the same over both bit periods. However, if the preceding bit is of the opposite value as the current bit, the output signal will be delayed as equalization transistor 22 takes longer to switch the output. Fortunately, this delay will be fairly constant and can be accounted for by assuming a static phase delay and using the same comparator circuit for phase detection.

Figure 3:
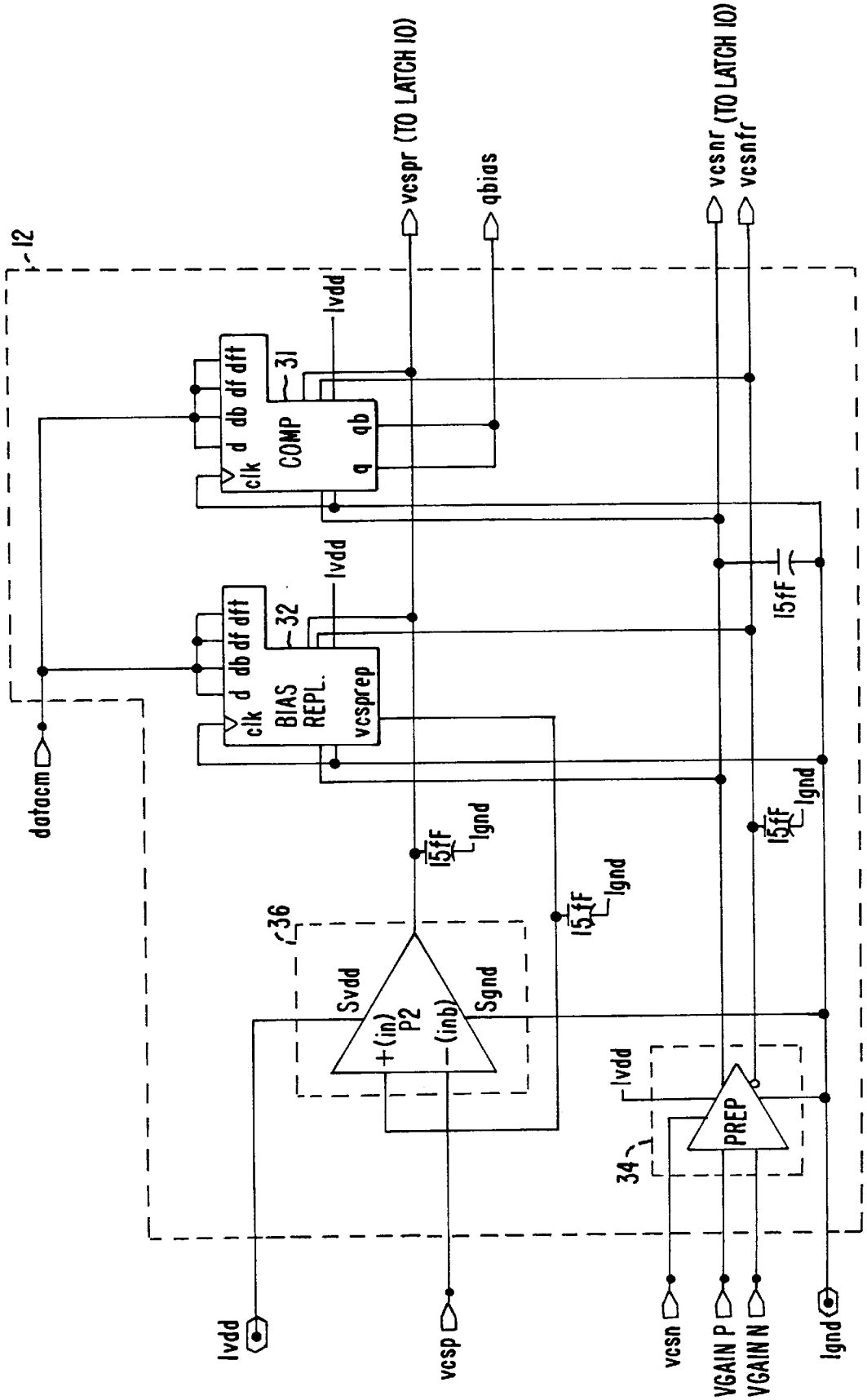
FIG. 3 is a schematic diagram showing the bias network of FIG. 1 in greater detail, including a bias replica circuit, a buffer replica circuit and an op-amp.

Referring now to FIG. 3, bias network 12 is shown in greater detail and explains how the bias voltages VCSNR, VCSNFR and VCSPR are generated. Bias network 12 is shown comprising a bias comparator 31, a bias replica circuit 32, a buffer replica circuit 34 and an op-amp circuit 36.

Figures 7, 7A:
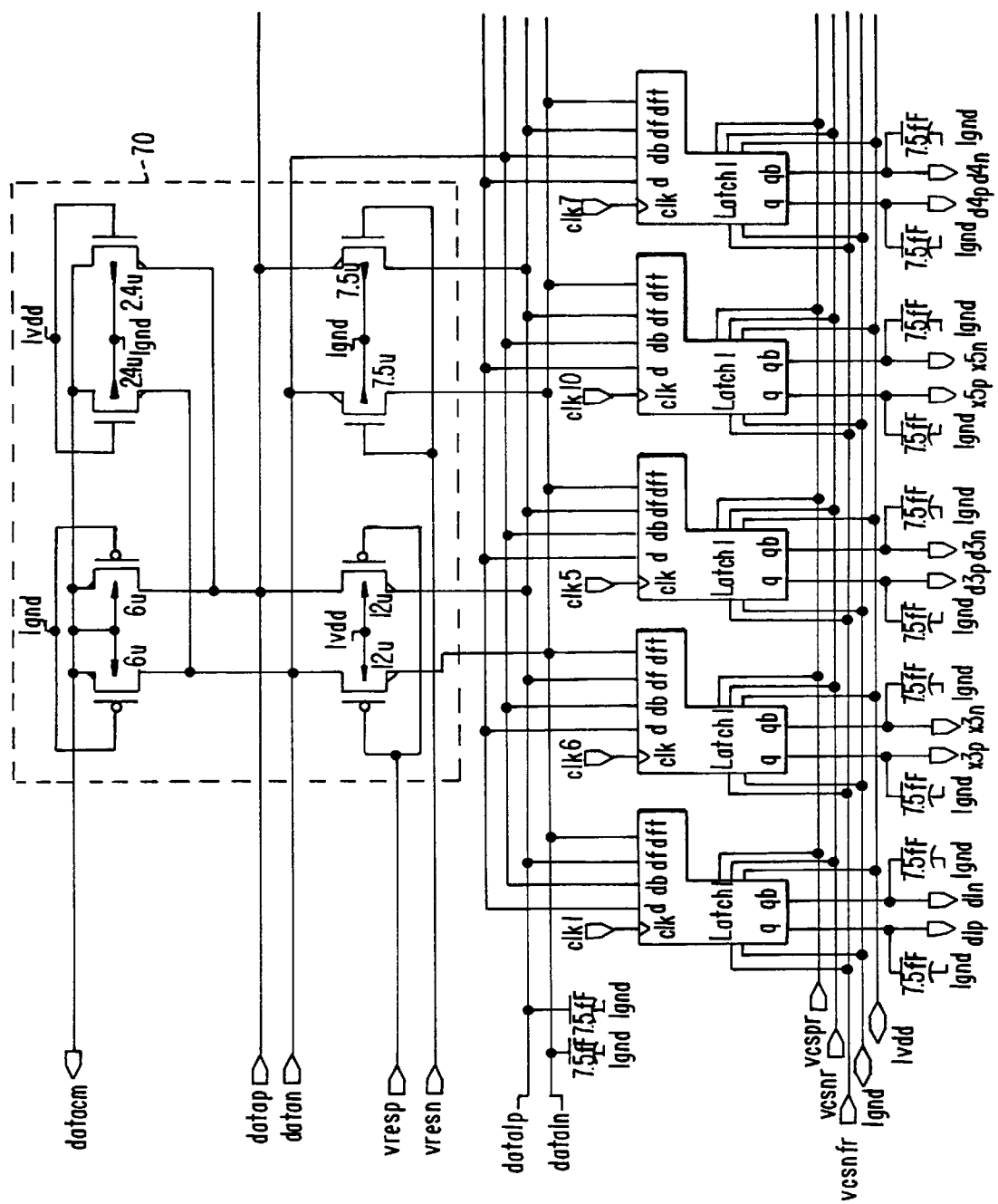
FIG. 7 is a schematic diagram of an amplifier row.
Figure 7B:
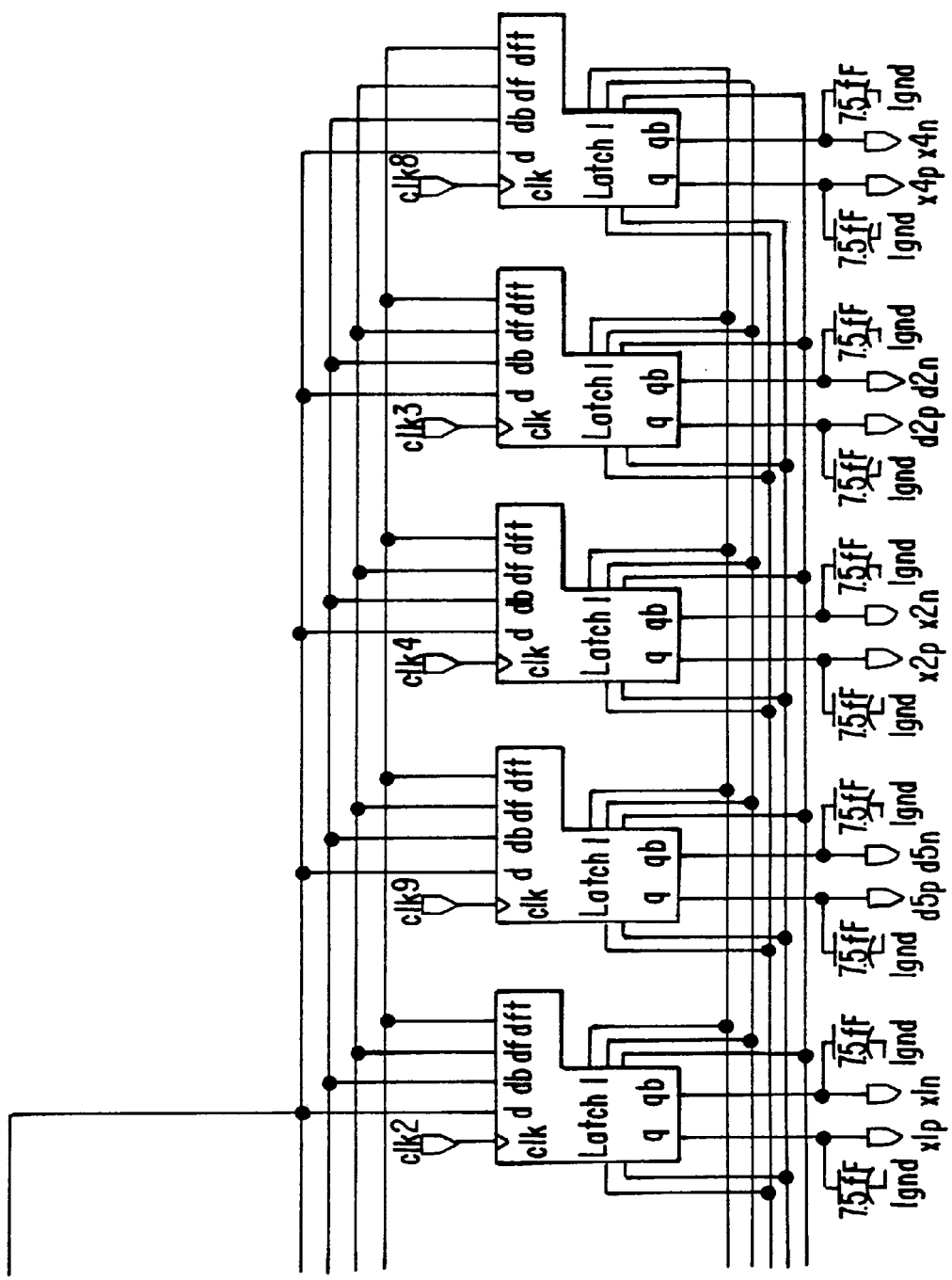

Bias comparator 31 is a circuit which is identical to comparator 10. All of the data inputs are coupled to a DATACM signal, which provides a common-mode level of the input signals. An example of how DATACM is generated is shown in FIG. 7 and described below in connection with that figure. With all the data inputs of bias comparator 31 set to DATACM, the CLK input of bias comparator 31 held low (putting the circuit in tracking mode), and the Q, QB outputs tied together, bias comparator 31 generates QBIAS which is a voltage corresponding to the average Q and QB.

Figure 4:
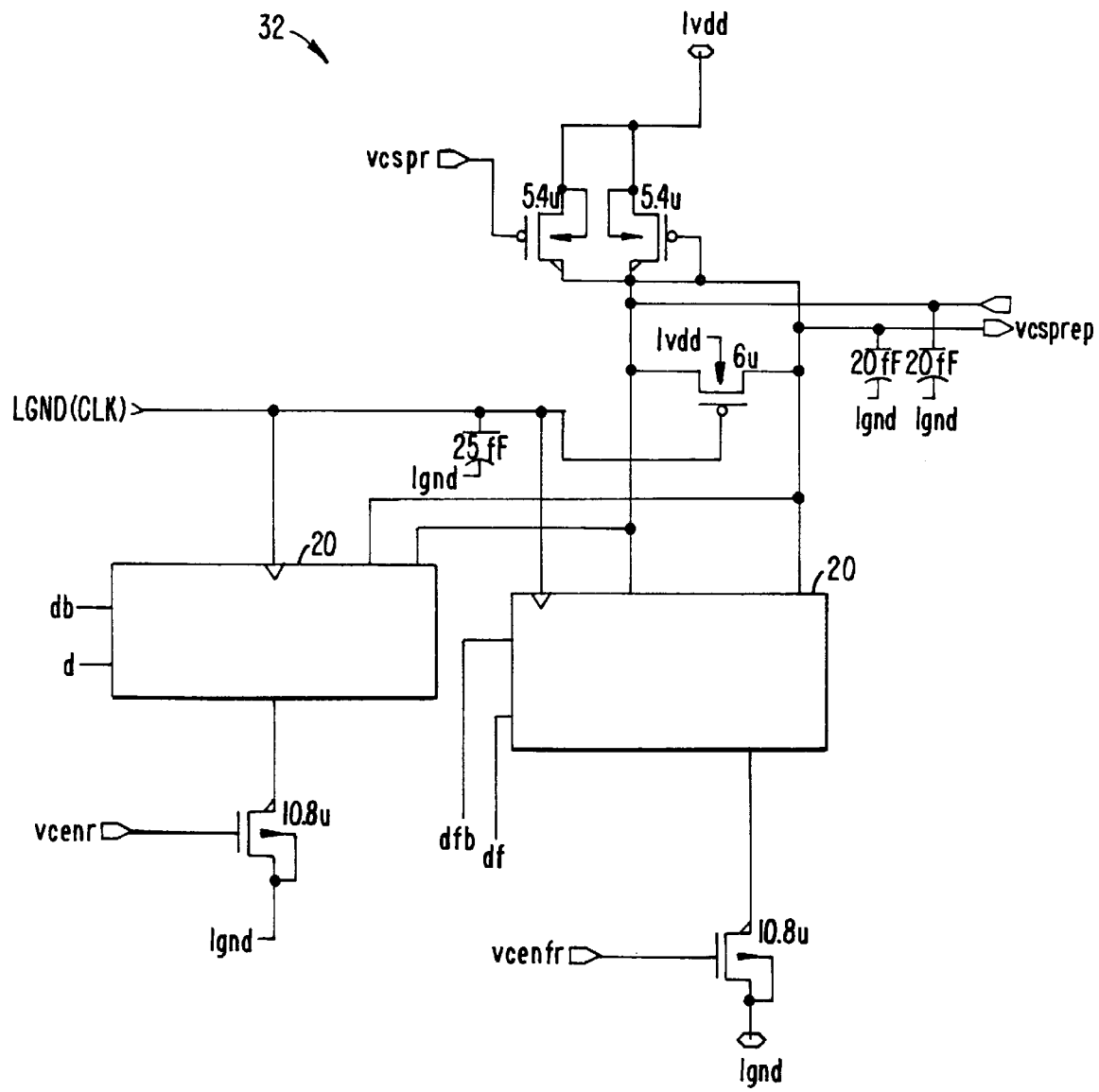
FIG. 4 is a schematic diagram showing the bias replica circuit of FIG. 3 in greater detail.

Bias replica circuit 32 replicates comparator 10 in a similar manner. Bias replica circuit 32, shown in greater detail in FIG. 4, is the same as comparator 10, except that only one half of transistor network 28 is replicated in bias replica circuit 32. With only half of transistor network 28, VCSPREP at the output of bias replica circuit 32 is a level slightly higher than the Q/QB common-mode output level. The output of bias replica circuit 32 is used to replicate VCSP at the VCSPR output. It does this through its VCSPREP output which is one input to op-amp 36. VCSP is used to set the Q/QB common-mode level by controlling transistor network 28. VCSN is used to control a trade-off between current consumption and bandwidth. A higher VCSN raises both VCSNR and VCSNFR, thus raising the tail currents of input stages 20. Higher tail currents increases the bandwidth of comparator 10 (and by symmetry, bias comparator 31 and bias replica circuit 32 as well). Lowering VCSN reduces the bandwidth, as more time is required to move the outputs through the same voltage shift, but also reduces power consumption. This allows the designer of a serial link system to easily configure the system to minimize power consumption to that required for the bandwidth used.

Buffer replica circuit 34 generates the voltages, VCSNR and VCSNFR, which control the ratio of tail currents in input stages 21 of comparator 10 (shown in FIG. 2), based on VCSN and a pair of signals VGAINN/VGAINP, which are user-controlled levels whose ratio is used to set the ratio of the tail current control signals VCSN and VCSNR. The ratio of tail currents in turn determines the relative contribution of the filtered (DF/DFB) differential input relative to the direct (D/DB) differential input.

Referring now to FIG. 4, bias replica circuit 32 is shown in greater detail. As explained above, bias replica circuit 32 is similar to comparator 10, except for the use of only two transistors in its output transistor network. As with bias comparator 31, the outputs of bias replica circuit 32 are shorted together. The output shorting for bias comparator 31 is shown in FIG. 2; the output shorting for replica bias circuit 32 is shown in FIG. 4—note the connection across the equalization transistor. As the equalization transistors are shorted and their gates are tied low (CLK signals tied to LGND), they are not really needed, but are left in to provide layout matching to reduce transistor offsets. The actual layout of bias replica circuit 32 might also include a layout of transistors corresponding to transistors 27p and 30p of comparator 10 (see FIG. 2) with those transistors left unconnected.

Figure 5:
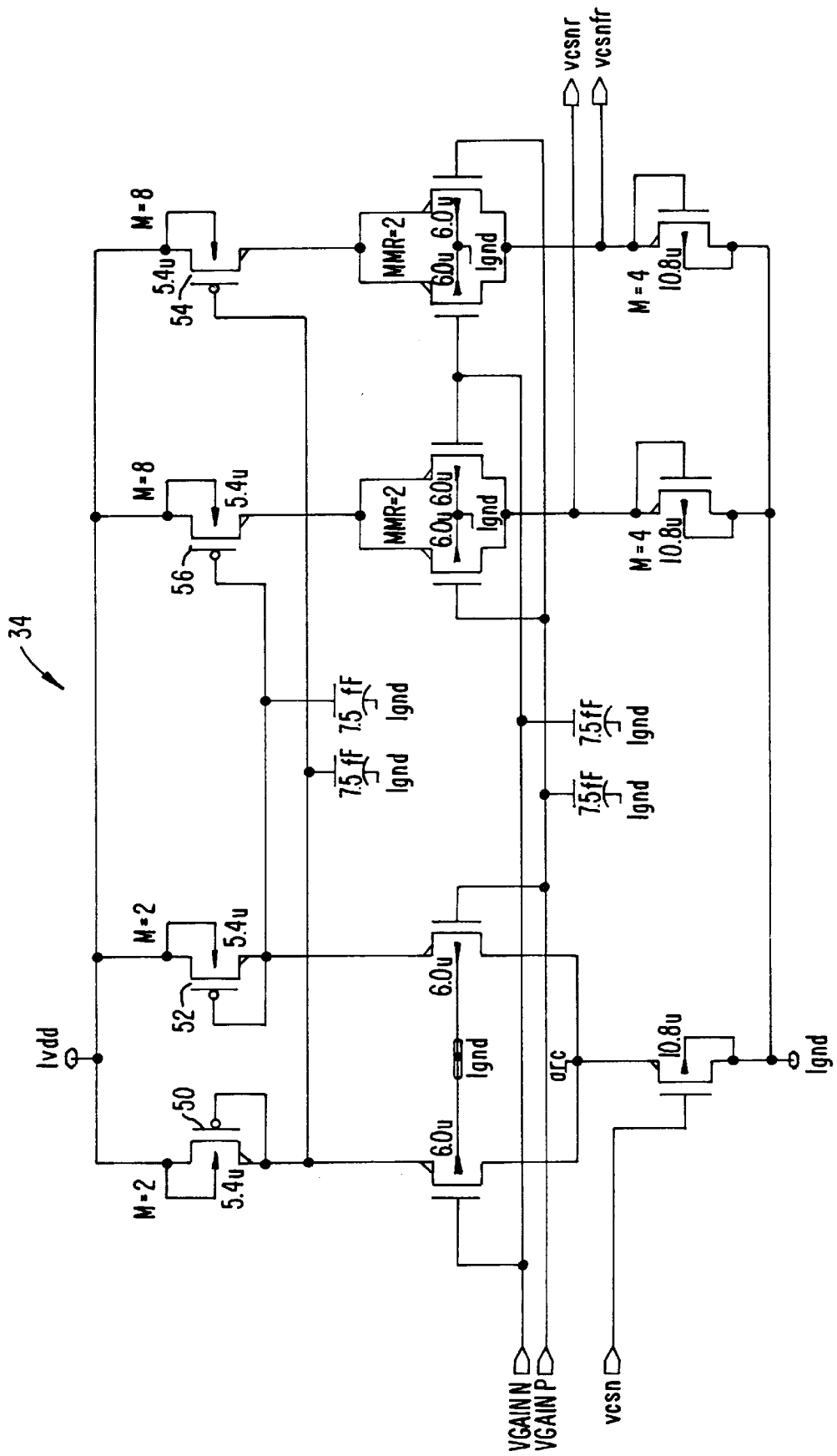
FIG. 5 is a schematic diagram showing the buffer replica circuit of FIG. 3 in greater detail.

FIG. 5 shows buffer replica circuit 34 in greater detail. One overall purpose of buffer replica circuit 34 is to output VCSNR and VCSNFR current levels which sum to the VCSN current and have the same ratio as VGAINP/VGAINN. The total current through transistors 50, 52 is controlled by VCSN, while the relative current through each is controlled by VGAINP/VGAINN. The current through transistors 50 and 52 is mirrored onto transistors 54 and 56 respectively, which in turn control VCSNR and VCSNFR.

Figure 6:
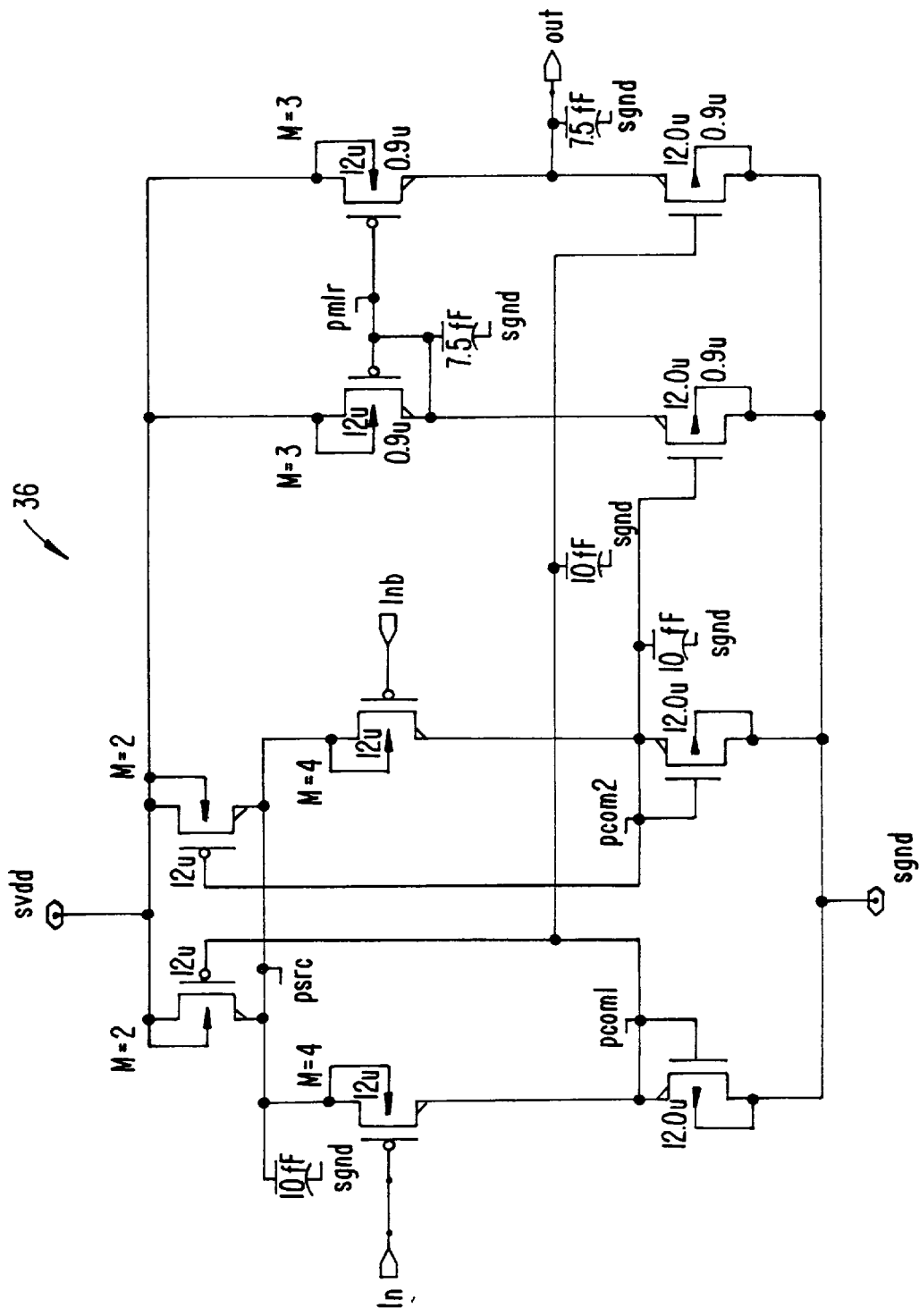
FIG. 6 is a schematic diagram showing the op-amp of FIG. 3 in greater detail.

FIG. 6 shows op-amp 36 in greater detail. As shown in FIG. 3, the inputs to op-amp 36 are VCSPREP (+) from bias replica circuit 32 and VCSP (−). The output of op-amp 36 is coupled to the VCSPR input of bias replica circuit 32 to form a control loop which keeps VCSPR at a level slightly higher than VCSP.

FIG. 7 is a schematic diagram of an amplifier row as might be used in a serial link amplifier. As shown there, ten comparators are used, so that bits can be amplified at one tenth the data rate. Also shown in FIG. 7 is a common-mode generator 70 for generating the DATACM bias level used by bias comparator 31 and bias replica circuit 32 (shown in FIG. 3).

Figure 8:
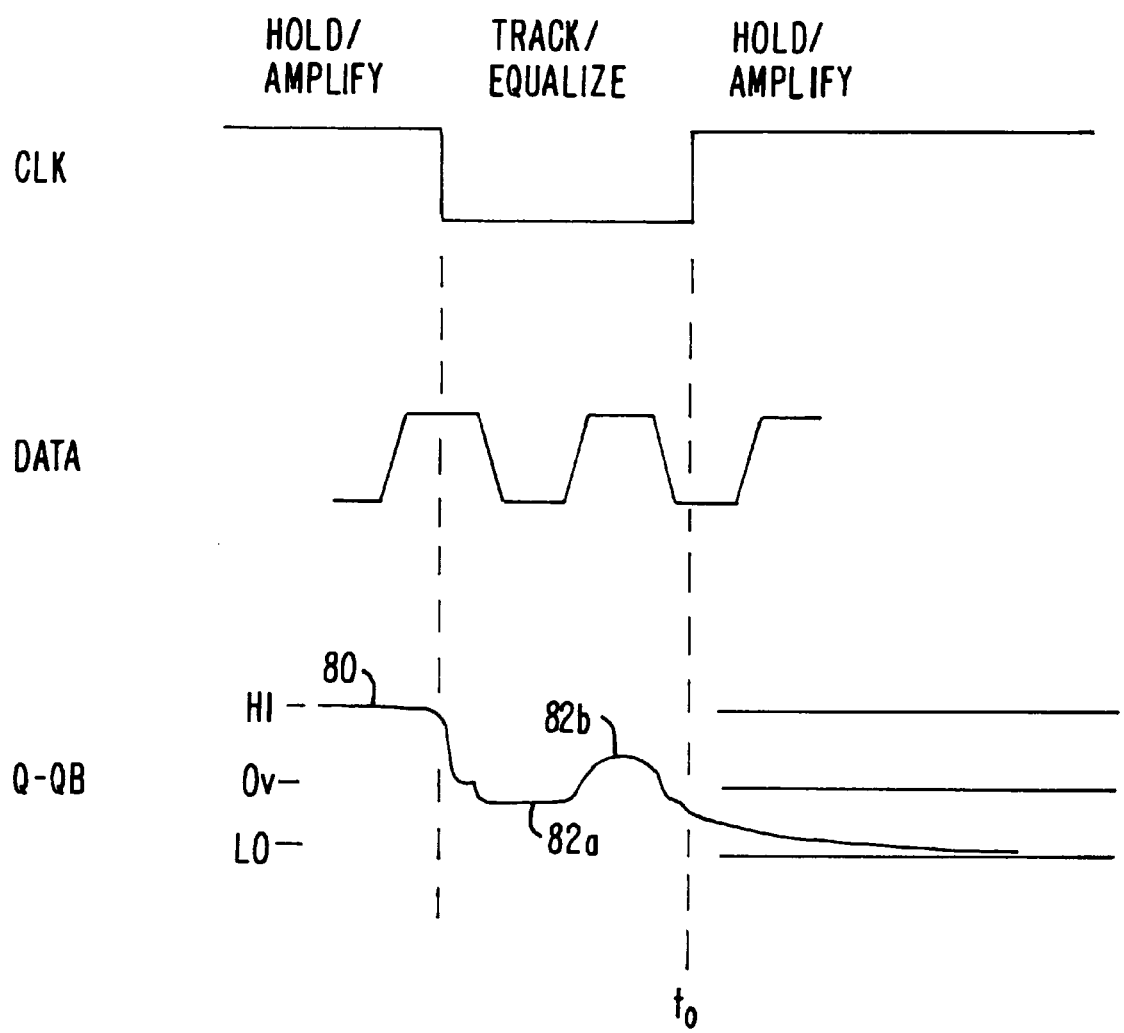
FIG. 8 is a timing diagram illustrating circuit operation.

The size of equalization transistor 22 (see FIG. 2) is able to be smaller than otherwise possible because equalization transistor 22 does not need to remove the effects of prior tracked bits, only the prior amplified bits. This is illustrated in the timing diagram of FIG. 8 which shows the CLK signal, the data signal and the differential output (Q-QB) of comparator 10 at and around a time $t_0$ when comparator 10 switches from a tracking mode to a holding mode holding a current bit value. A portion 80 of the differential output curve reflects the prior amplified bit (which in this example was a "HI"). When CLK goes low (tracking mode), the inputs are coupled to the outputs and equalization transistor 22 is turned on. This attenuates the effect of the input on the output, as illustrated by portions 82*a*, 82*b* of the differential output curve. The differential output curve is urged toward the common-mode level by the mechanism explained above.

When CLK goes high again, this time with the sampled bit being a "LO", equalization transistor 22 need only remove the effects of the prior amplified bit (80), not the prior tracked bits (82*a*, 82*b*). The reason for this is that there is little voltage due to the prior tracked bit to slew through when CLK goes high, since the differential output is near zero (i.e., the Q and QB voltages are both near the common-mode level for the output). When CLK goes low, the differential output need only be driven from the HI or LO level to zero, as opposed to both of the outputs, for example, being driven to one or the other rail.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A sample-and-hold circuit, wherein an input is tracked at an output during a tracking period and the input is held during an holding period, the tracking period and holding period defined by a clock signal input to the sample-and-hold circuit, wherein the output is a differential output having a positive output node and a negative output node with the output signal represented by a voltage difference from the negative output node to the positive output node, the sample-and-hold circuit comprising:

equalizing means, coupled between the positive output node and the negative output node, for flowing current during the tracking period between the negative and positive output nodes to draw the negative and positive output nodes to a common mode signal level.

2. The sample-and-hold circuit of claim 1, wherein the equalizing means is a transistor and a gate of the transistor is coupled to the clock signal input.

3. The sample-and-hold circuit of claim 2, wherein the transistor is sized to lower a gain of the sample-and-hold circuit during the tracking period to a nonzero tracking gain.

4. The sample-and-hold circuit of claim 3, further comprising a phase detector which adjusts to phase shifts caused by the gain of the sample-and-hold circuit being greater than zero during the tracking period.

5. The sample-and-hold circuit of claim 1, further comprising at least one input stage coupled to the equalizing means, wherein the at least one input stage includes means for latching its input signal where the means for latching is coupled to a clock signal defining the tracking period and the holding period so as to latch its input signal during the tracking period.

6. The sample-and-hold circuit of claim 1, further comprising:

two input stages with stage outputs coupled to the output nodes, wherein current through each of the input stages is summed at the output nodes; and means for controlling a ratio of current through the two input stages.

7. The sample-and-hold circuit of claim 1, further comprising an input stage with a tail current proportional to a voltage controlled oscillator current.

8. The sample-and-hold circuit of claim 1, further comprising means for maintaining a common mode level of the output nodes at a common mode level for input signals to a voltage controlled oscillator.

* * * * *